United States Patent
Wong et al.

[19]

[11] Patent Number: 6,124,618
[45] Date of Patent: Sep. 26, 2000

[54] DYNAMIC THRESHOLD MOSFET USING ACCUMULATED BASE BJT LEVEL SHIFTER FOR LOW VOLTAGE SUB-QUARTER MICRON TRANSISTOR

[75] Inventors: Shyh-Chyi Wong, Taichung; Mong-Song Liang, Hsin-chu, both of Taiwan

[73] Assignee: Taiwan Semiconductor Manufacturing Company, Ltd., Hsin-Chu, Taiwan

[21] Appl. No.: 09/379,281

[22] Filed: Aug. 23, 1999

Related U.S. Application Data

[62] Division of application No. 09/245,562, Feb. 5, 1999, Pat. No. 5,994,177.

[51] Int. Cl.[7] .................................................. H01L 29/72
[52] U.S. Cl. ........................ 257/370; 257/378; 257/379; 257/565
[58] Field of Search .................................. 257/370, 378, 257/379, 565

[56] References Cited

U.S. PATENT DOCUMENTS

| | | | |
|---|---|---|---|
| 5,268,650 | 12/1993 | Schnabel | 330/300 |
| 5,326,710 | 7/1994 | Joyce et al. | 437/31 |
| 5,360,750 | 11/1994 | Yang | 437/31 |
| 5,387,553 | 2/1995 | Moksvold et al. | 437/32 |
| 5,614,424 | 3/1997 | Wong et al. | 437/31 |
| 5,747,871 | 5/1998 | Lee et al. | 257/565 |

*Primary Examiner*—Edward Wojciechowicz
*Attorney, Agent, or Firm*—George O. Saile; Stephen B. Ackerman; Billy J. Knowles

[57] ABSTRACT

A dynamic threshold voltage MOSFET to provide increase drain-to-source saturation current ($I_{DSsat}$) and lower off current ($I_{off}$) is described. The dynamic threshold voltage MOSFET has a first diffusion-well of a material of a first conductivity type formed at the surface of the substrate to form a bulk region. A source region and a drain region of a material of a second conductivity type are diffused into the diffusion-well. A first gate is then placed on a first oxide surface above the substrate between the source and drain regions. An accumulated base bipolar transistor is then placed on the semiconductor substrate. The base of the accumulated base bipolar transistor is connected to the gate, the emitter is connected to the diffusion-well. A resistor is connected between the emitter of the accumulated base bipolar transistor and a substrate biasing voltage source. A biasing circuit connected to the collector of the accumulated base bipolar transistor to provide a bias voltage for the accumulated base bipolar transistor.

9 Claims, 7 Drawing Sheets

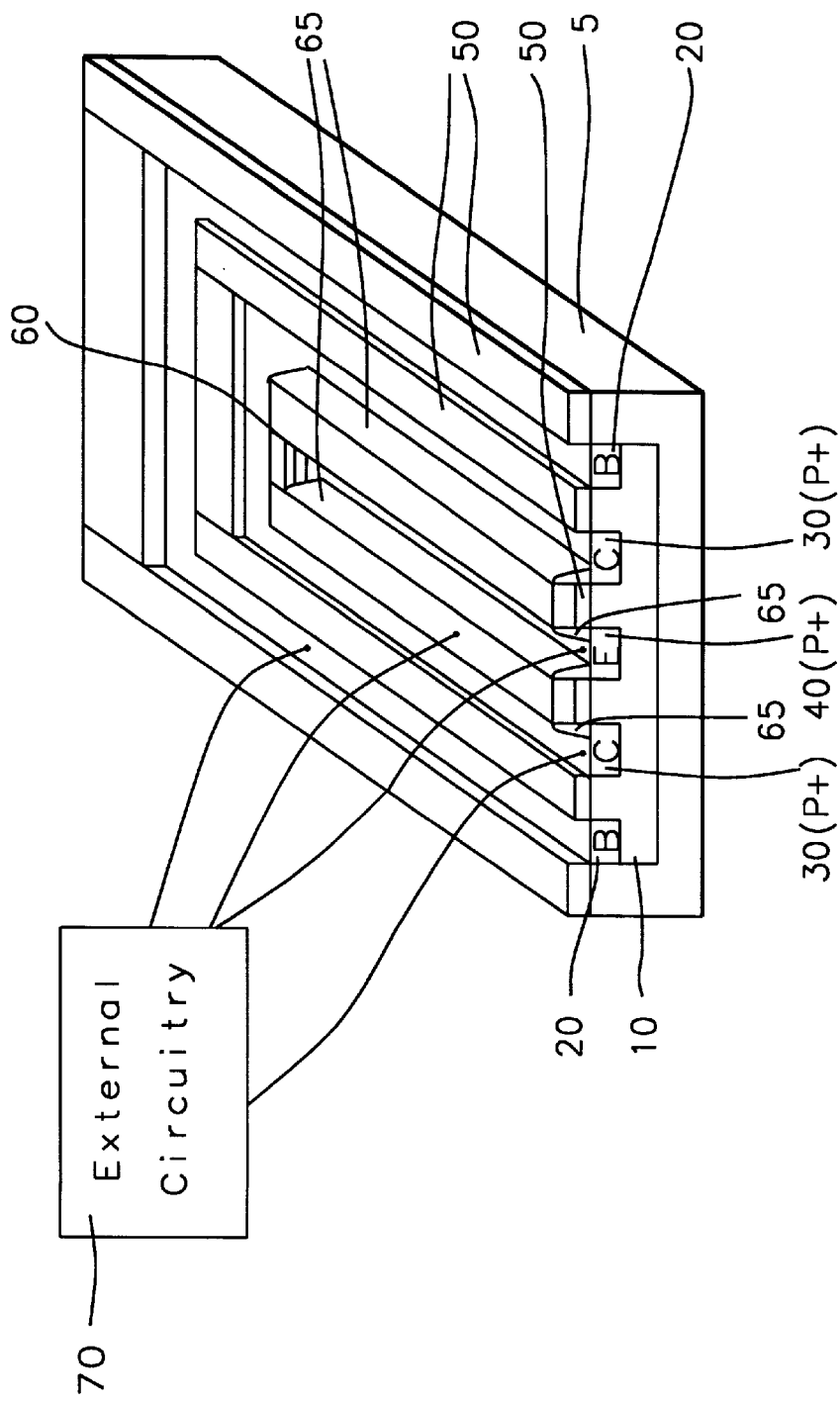
FIG. 1a – Prior Art

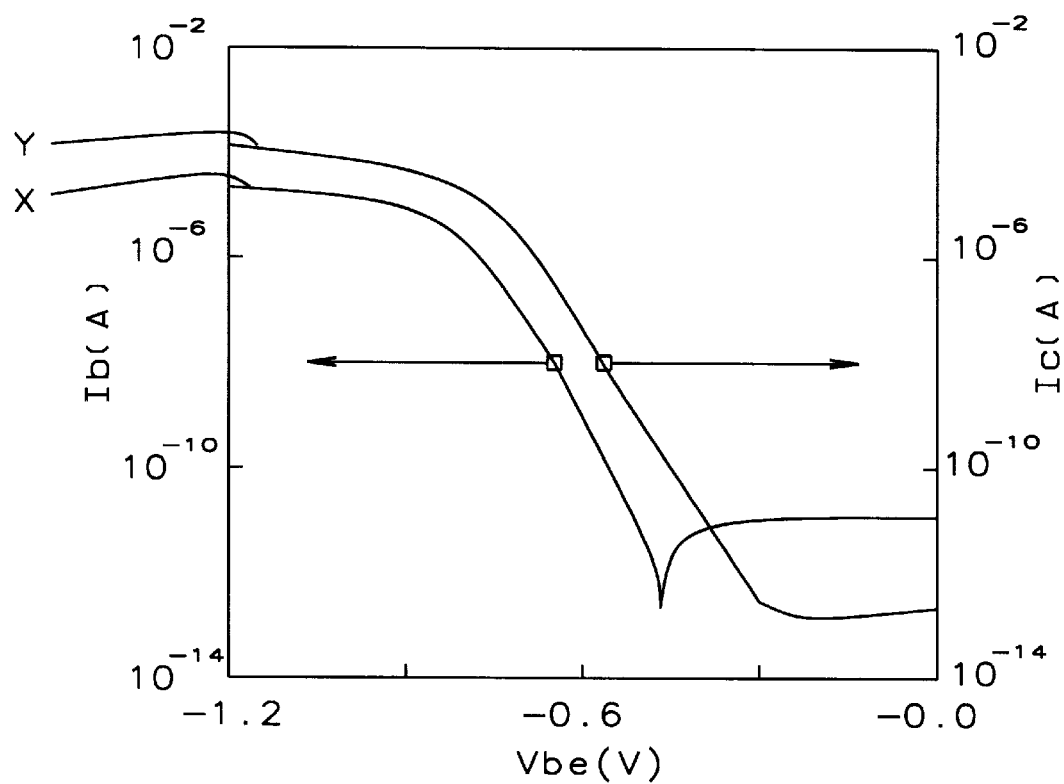
FIG. 1b – Prior Art

DYNAMIC THRESHOLD MOSFET USING ACCUMULATED BASE BJT LEVEL SHIFTER FOR LOW VOLTAGE SUB-QUARTER MICRON TRANSISTOR

This is a division of U.S. patent application Ser. No. 09/245,562, filing date Feb. 5, 1999, A Dynamic Threshold Mosfet Using Accumulated Base Bjt Level Shifter For Low Voltage Sub-Quarter Micron Transistor, assigned to the same assignee as the present invention now U.S. Pat. No. 5,994,177, issued Nov. 30, 1999.

BACKGROUND OF THE INVENTION

1. Field of the Invention

This invention relates to metal oxide semiconductor field effect transistors (MOSFET). More particularly, this invention relates to devices and methods of dynamically modifying the threshold voltage ($V_T$) of a MOSFET to maximize the drain-to-source saturation current ($I_{DS\ sat}$) while minimizing the drain-to-source leakage current ($I_{off}$).

2. Description of the Related Art

It is well known in the art that the drain-to-source saturation current ($I_{DSsat}$) is given by the formula:

$$I_{DSsat} = \frac{\beta}{2}(V_{GS} - V_T)^2 \qquad \text{Eq. 1}$$

$$\text{where: } \beta = \frac{W}{L}KP$$

W is the width of the channel of the MOSFET.
L is the length of the channel of the MOSFET.
KP is the transconductance parameter of the MOSFET.
$V_{GS}$ is the gate-to-source voltage,
$V_T$ is the threshold voltage of the MOSFET.

It is further well known in the art that the threshold voltage $V_T$ is determined by the formula:

$$V_T = V_{TO} \pm \gamma\sqrt{2\phi_F - V_{BS}} - \sqrt{2\phi_F} \qquad \text{Eq. 2}$$

where:
$V_{TO}$ is the zero bias threshold voltage of the MOSFET.
$\gamma$ is the body factor or the bulk polarization factor of the MOSFET.
$2_{\phi F}$ is the surface potential at the source side of the channel of the MOSFET under strong inversion.
$V_{BS}$ is the bulk-to-source voltage of the MOSFET.

FIG. 7 shows a plot 220 of the function of the threshold voltage $V_T$ as a function of the bulk-to-source voltage $V_{BS}$. This plot 220 shows the decrease in threshold voltage $V_T$ with an increase in bulk-to-source threshold voltage according to Eq. 2.

The drain-to-source leakage current ($I_{off}$) when the gate-to-source voltage of the MOSFET is less than the threshold voltage ($V_T$) is determined by the formula:

$$I_{off} = \frac{W}{L}I_{DO}e^{\left(\frac{V_{GS}}{nKT/q}\right)} \qquad \text{Eq. 3}$$

where:
W/L is the ratio of the channel width of the MOSFET to the channel length of the MOSFET.
$I_{DO}$ is the drain-to-source current with the gate-to-source voltage ($V_{GS}$) equal to 0.

K is Boltzmans' constant.
T is the temperature.
q is the charge of an electron.
n is determined by the formula:

$$n = \frac{C_{BC}}{C_{GC}} + 1$$

where
$C_{BC}$ is the bulk to channel capacitance, which is determined by the bulk-to-source voltage ($V_{BS}$).
$C_{GC}$ is the gate-to-channel capacitance.

As can be seen that by controlling the bulk-to-source voltage ($V_{BS}$), the drain-to-source saturation current $I_{DSsat}$ and the drain-to-source leakage current $I_{off}$ can be modified.

U.S. Pat. No. 5,614,424 (Wong et al.), assigned to the same assignee as the present invention, and shown in FIG. 1 describes a method for fabricating an accumulated-base junction transistor. Referring to FIG. 1, an n-type dopant material is implanted into a p-type substrate 5 and annealed to form the base region 10 of the accumulated-base BJT. A layer of an insulating material 50 such as silicon dioxide is grown on the p-type substrate 5 and the base region 10 to form the gate oxide area. A layer of polycrystalline silicon 60 is deposited on the gate oxide in the area that forms the gate region that is the base accumulation means. An $n^+$-type dopant is then implanted into the base region 10 and annealed to form a base contact region 20. A side wall spacer 65 is deposited adjacent to the polycrystalline silicon gate region 60. A $p^+$-type dopant is next implanted and annealed into the base region 10 into areas separated from the base contact region 20 to form a collector region 30 and a emitter region 40. The $p^+$-type dopants that are the collector region 30 and the emitter region 40 are self-aligned by the side wall spacer 65 and the polycrystalline silicon gate region 60. The insulating material 50 has openings over the base contact region 20, the collector region 30, the emitter region 40 so as to allow these regions to be connected to external circuitry 70.

Table 1 shows the relative doping levels and the energy levels for the materials that are implanted into the substrate. Table 2 shows the thickness and the temperatures for the deposition of the insulating material that forms the gate oxide and the polycrystalline silicon.

TABLE 1

| Material | Doping Electrons/cm³ | Energy |
| --- | --- | --- |
| n-well | $1e^{12}$–$1e^{14}$ | 180K ev |
| $p^+$ | $1e^{15}$–$6e^{15}$ | 30K ev |
| $n^+$ | $1e^{15}$–$6e^{15}$ | 30k ev |

TABLE 2

| Material | Thickness | Temperature |
| --- | --- | --- |
| Thermal Oxide (insulating material) | 50Å–150 Å | 800° C.–950° C. |
| Polycrystalline Silicon | 1500Å–3000Å | 450° C.–650° C. |

The base accumulator means (gate) 60 is connected to the emitter 40 and the external circuitry 70. When the external circuitry 70 provides a first voltage to the base accumulator 60 and the emitter region 40, a second voltage to the base contact region 20, and a third voltage to the collector region 30, an electron-type charge (which is the majority carrier) will accumulate at the interface of the insulating material 50 and the base region 10 between the collector region 30 and the emitter region 40. This charge will increase the conductivity of the base region 10, which will increase the transconductance (the ratio of the current flowing into the collector region 30 ($I_c$) to the voltage developed between the base region 10 and the emitter region 40 ($V_{be}$)). FIG. 1b shows a plot X of the current into the base contact region 20 ($i_b$) and a plot Y of the current into the collector region 30 ($I_c$) versus the base-emitter voltage ($V_{be}$). The change in the base-emitter voltage ($V_{be}$) with respect to a 10 fold (decade) change in the current in to the base contact region 20 ($I_b$) and ($I_c$) is approximately 60 mv which is similar to that of conventional vertical BJT's.

U.S. Pat. No. 8,326,710 (Joyce et al.) describes a lateral PNP transistor structure is fabricated in a BICMOS process utilizing the same steps as are used during the. BICMOS process fabricating NPN and CMOS transistors without requiring additional steps. A base N+ buried layer formed in the IC substrate that underlies the bipolar PNP transistor. A base Retro and a base contact are formed in the base N+ buried layer using the CMOS Retro NWELL mask, etch and N-type introduction sequence. An epitaxial layer of undoped or low doped EPI is deposited across the IC substrate and isolation oxide regions isolating the PNP transistor are grown during the isolation oxide mask, etch and grow sequence. The NPN collector sink definition mask, etch and N-type introduction sequence is used to form a PNP base contact N+ sink region to the N-well and N+ buried layer. A field oxide spacer FOX is grown during the CMOS active area definition mask, etch and grow sequence for separating the PNP base from the PNP collector. A uniform layer of polysilicon is masked and etched during the POLY definition mask and etch sequence to form a self aligned transistor mask for critically defining the PNP base width and base active region. The PNP collector region and emitter region are introduced through the POLY mask using at least one of the NPN base definition mask, etch, and P-type introduction sequence and PMOS source/drain mask definition, etch, and P-type introduction sequence. The PNP base contact region can be formed using the NPN emitter definition mask sequence. The PNP transistor contact surfaces and metal contacts are thereafter prepared according to conventional procedures.

U.S. Pat. No. 5,360,750 (Yang) provides a method for fabricating a lateral bipolar transistor with a shorter manufacturing cycle time. The method for fabricating NPN lateral bipolar transistors on an N-type substrate begins by implanting a P-type impurity into a predetermined position on the substrate and driving the impurity in to form a P-well in the substrate. An N-type impurity is implanted in predetermined positions in the P-well to form the collector regions of the NPN transistor. The implanting a P-type impurity into predetermined positions in the P-well to form contacts for the base electrodes of the NPN transistor. An N-type impurity is then implanted into predetermined positions in the P-well and the collector region, to form respective emitter electrodes and collector electrodes of the NPN transistor. A field oxide layer is formed over the NPN transistors and metal contacts are formed to the base electrode, the collector electrode and the emitter electrode of the NPN transistor.

U.S. Pat. No. 5,268,650 (Schnabel) describes a circuit for an operational amplifier which provides very high amplification of an input signal with low currents while, at the same time; not increasing the offset voltage drift. The amplifier has an input stage, at lest one intermediate stage, and an output stage each formed of MOSFET's and bipolar transistors.

SUMMARY OF THE INVENTION

An object of this invention is to provide a MOSFET having a higher drain-to-source saturation current ($I_{DSsat}$) and a lower drain-to-source leakage current ($I_{off}$).

Another object of this invention is to provide a dynamic threshold voltage ($V_T$) modification circuit to change dynamically the bulk-to-source voltage of a MOSFET to provide a higher drain-to-source saturation current ($I_{ds\ sat}$).

To accomplish these and other objects a dynamic threshold voltage MOSFET has a first diffusion-well of a material of a first conductivity type formed at the surface of the substrate to form a bulk region. A source region and a drain region of a material of a second conductivity type are diffused into the diffusion-well. A first gate is then placed on a first oxide surface above the substrate between the source and drain regions. An accumulated base bipolar transistor is then placed on the semiconductor substrate. The base of the accumulated base bipolar transistor is connected to the gate, the emitter is connected to the diffusion-well. A resistor is connected between the emitter of the accumulated base bipolar transistor and a substrate biasing voltage source. A biasing circuit connected to the collector of the accumulated base bipolar transistor to provide a bias voltage for the accumulated base bipolar transistor.

A voltage developed between the bulk and the source ($V_{BS}$) of the dynamic threshold voltage MOSFET is increased as a voltage is applied between the gate and the source is increased thus reducing the threshold voltage $V_t$ of the dynamic threshold voltage MOSFET, increasing the drain-to-source saturation current as a result of the accumulated base bipolar transistor turning on and developing a voltage across the resistor. When the gate voltage $V_{GS}$ of the dynamic threshold voltage MOSFET is reduced below the turn-on voltage of the accumulated base bipolar transistor (usually around 0.7 V), the accumulated base bipolar transistor is turned off, the well of the dynamic threshold MOSFET will be connected to the substrate biasing voltage source through the resistor.

The accumulated base bipolar junction transistor is formed by a second diffusion-well of the material of the first conductivity type being formed at the substrate. The second diffusion-well forms the base of the accumulated base bipolar transistor. A source region and an emitter region of the material of the second conductivity type is diffused into the second diffusion-well to form the collector and the emitter of the accumulated base bipolar junction transistor. The gate of the accumulate base bipolar transistor is placed on a second oxide surface and connected to the source region.

The substrate is either a semiconductor substrate of a material of the second conductivity type and the first diffusion is diffused into the semiconductor substrate, or the substrate is an insulating material with an epitaxial semiconductor layer deposited on the surface of the insulating material.

The accumulated base bipolar transistor occupies only a small portion of the area dynamic threshold voltage MOSFET. The accumulated base bipolar transistor portion of the dynamic threshold voltage MOSFET occupies an area that is from 10% to 100% area of the MOSFET of the dynamic threshold voltage MOSFET.

BRIEF DESCRIPTION OF THE DRAWINGS

FIG. 1a is a three dimensional view of a accumulated-base bipolar transistor of the prior art.

FIG. 1b is a plot of the base current ($I_b$) and the collector current ($I_c$) versus the base-emitter voltage ($V_{BE}$) of the accumulated base bipolar transistor of the prior, art.

DETAILED DESCRIPTION OF THE INVENTION

Figure 2:
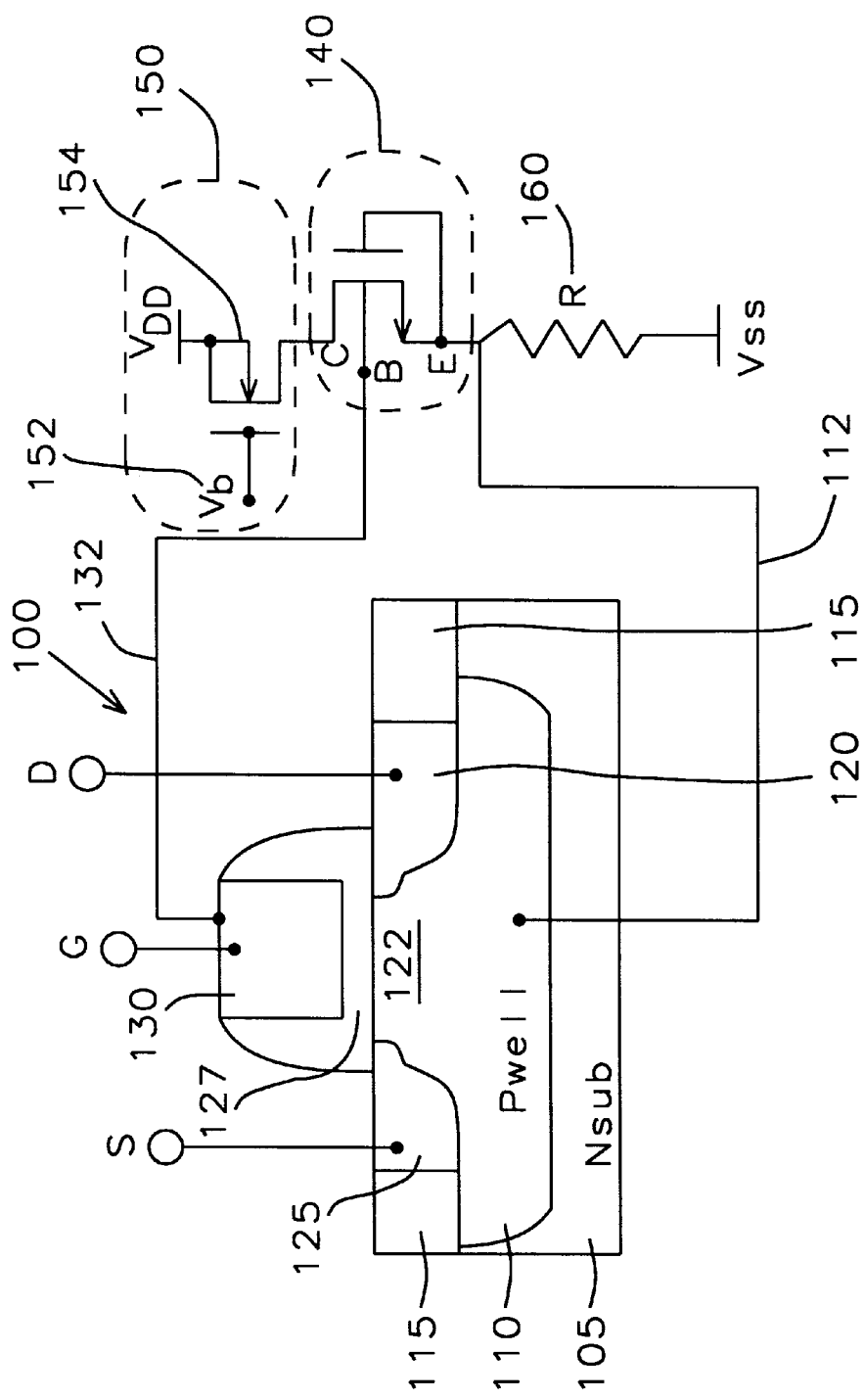
FIG. 2 is a cross-sectional view of a MOSFET and a schematic drawing of a dynamic threshold voltage modification circuit of this invention.

Refer now to FIG. 2 for a description of a dynamic threshold voltage modification circuit. A MOSFET 100 is formed on the n-type semiconductor substrate 105. A p-well 110 is diffused into the n-type semiconductor substrate 105. A drain diffusion 120 and source diffusion 125 are formed by implanting an n-type material into the p-well 110 to form the bulk region of the MOSFET 100. The drain diffusion 120 is separated from the source diffusion 125 by the channel region 122. A gate 130 is deposited over the gate oxide 127 in the channel region 122 between the drain region 120 and the source region 125. The shallow trench isolation 115 will circumscribe the MOSFET 100 to isolate it from adjacent circuitry. The gate 130 of the MOSFET 100 is connected to the base B of the accumulated-base bipolar transistor 140. The emitter E of the accumulated-base bipolar transistor 140 is connected through the resistor R 160 to a substrate biasing voltage source $V_{SS}$. The emitter E of the accumulated-base bipolar transistor 140 is further connected 112 to the bulk region 110 of the MOSFET 100.

The collector C of the accumulated-base bipolar transistor 140 is connected to the bias circuit 150. The bias circuit consist of the MOSFET 1540 with it's drain connected to the power supply voltage source $V_{DD}$, its base connected to a biasing voltage source $V_b$ and its source connected to the collector C of the accumulated-base bipolar transistor 140. In an integrated circuit employing multiple dynamic threshold voltage modification circuits, the bias circuit 150 is common to all the dynamic threshold modification circuits.

The dynamic threshold modification circuit functions by developing a voltage between the bulk region 110 and the source region 125 of the MOSFET 100. To accomplish this, a voltage is placed between the gate terminal G and the source terminal S of the MOSFET 100. As the voltage becomes greater than approximately 0.7 V, the accumulated-base bipolar transistor 140 begins to conduct. The emitter current through the accumulated-base bipolar transistor 140 creates a voltage drop across the resister R 160 and between the bulk region 100 and the source region 125. This voltage $V_{BS}$ as described above increases the drain-to-source saturation current of the MOSFET 100.

Conversely, as the voltage placed between the gate terminal G and the source terminal S decreases below 0.7 V, the accumulated-base bipolar transistor 140 is cut off and its emitter current through the resistor R 160 ceases to flow. The voltage between the bulk region 110 and the source region 125 of the MOSFET 100 approaches 0 V and the drain-to-source leakage current $I_{off}$ of the MOSFET 100 approaches that of the current caused by leakage at the surface of the channel 122.

By appropriately adjusting the bulk-to-source voltage $V_{BS}$ dynamically, the drain-to-source saturation current ($I_{DSsat}$) can be increased independent of the drain-to-source leakage current $I_{off}$.

Figure 3:
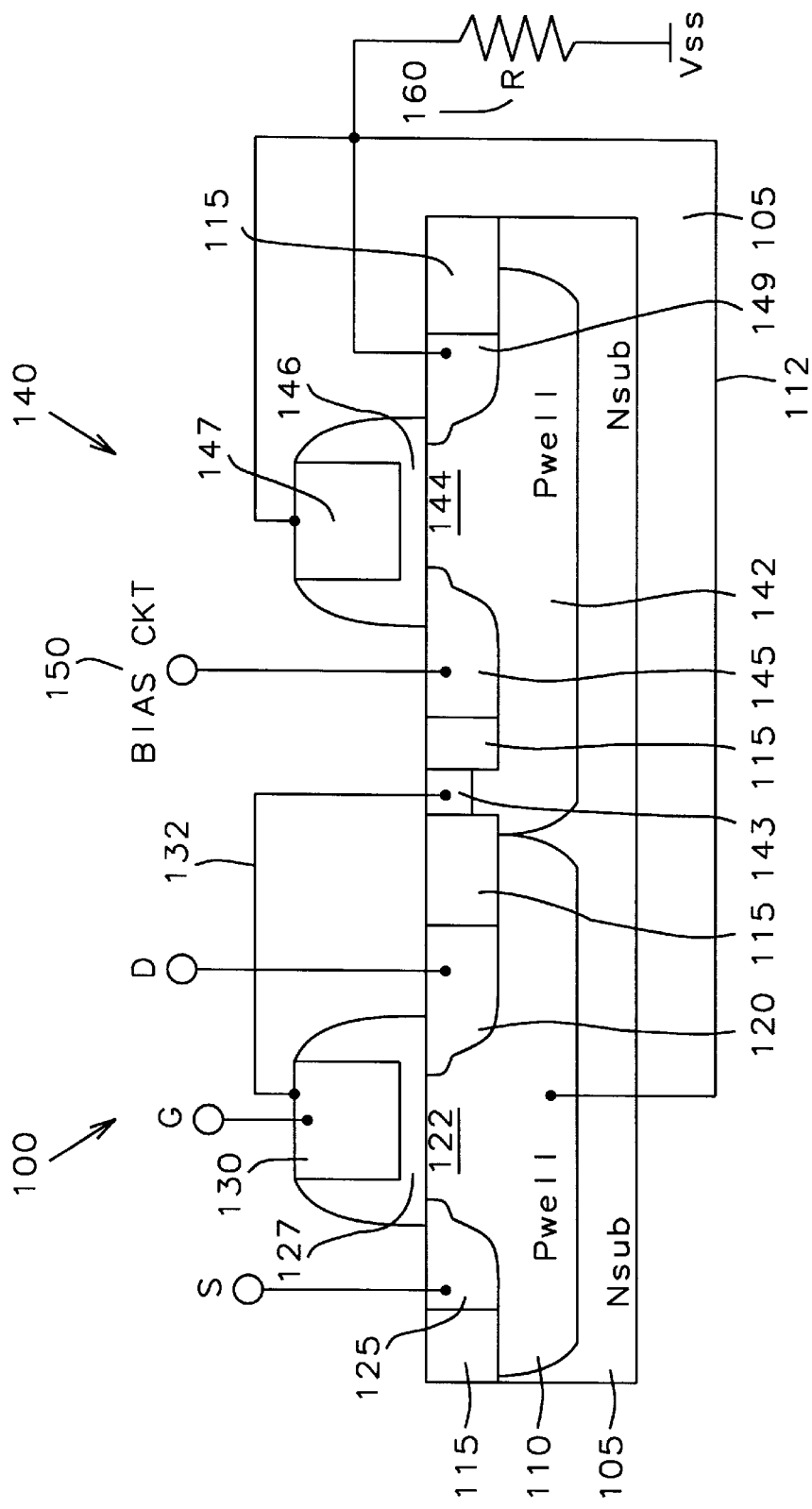
FIG. 3. is a cross-sectional view of a dynamic threshold voltage MOSFET on a semiconductor substrate of this invention.

FIG. 3 shows an integrated dynamic threshold voltage MOSFET of this invention. The MOSFET 100 is as shown in FIG. 2. A first p-well is diffused into the n-type substrate 105. The drain region 120 and the source region 125 are then formed by implanting an n-type material into the p-well 110. The gate 130 of the MOSFET is then formed over a gate oxide 127 above the channel region 122 between the drain region 120 and the source region 125.

A second p-well 142 is diffused into the n-type semiconductor substrate 105 to form the bulk region and base of the accumulated-base bipolar transistor 140. The P+ implant 143 forms the base terminal of the accumulated-base bipolar transistor 140. The source region 149 is formed by implanting an n-type material into the p-well 142 to create the emitter of the accumulated-base bipolar transistor 140. The drain region 145 is formed by similarly implanting the n-type material into the p-well 142 to create the collector of accumulated-base bipolar transistor 140. The gate 147 is formed over the gate oxide 146 in the channel region 144 between the collector 145 and the emitter 149 of the accumulated-base bipolar transistor 140.

A shallow trench isolation 115 is placed to circumscribe the areas of the MOSFET 1100 and the accumulated-base bipolar transistor 140 to isolate each from the other and from adjacent circuitry.

The base terminal 143 of the accumulated-base bipolar transistor 140 is connected 132 to the gate of the MOSFET 100. The emitter 149 of the accumulated-base bipolar transistor 149 is connected to the gate 147, to one terminal of the resistor R 160 and to the bulk region 110 of the MOSFET 100. The second terminal of the resistor R 160 is connected to the substrate biasing voltage source $V_{SS}$. The collector of the accumulated-base bipolar transistor 140 is connected to the bias circuit 150.

Figure 4:
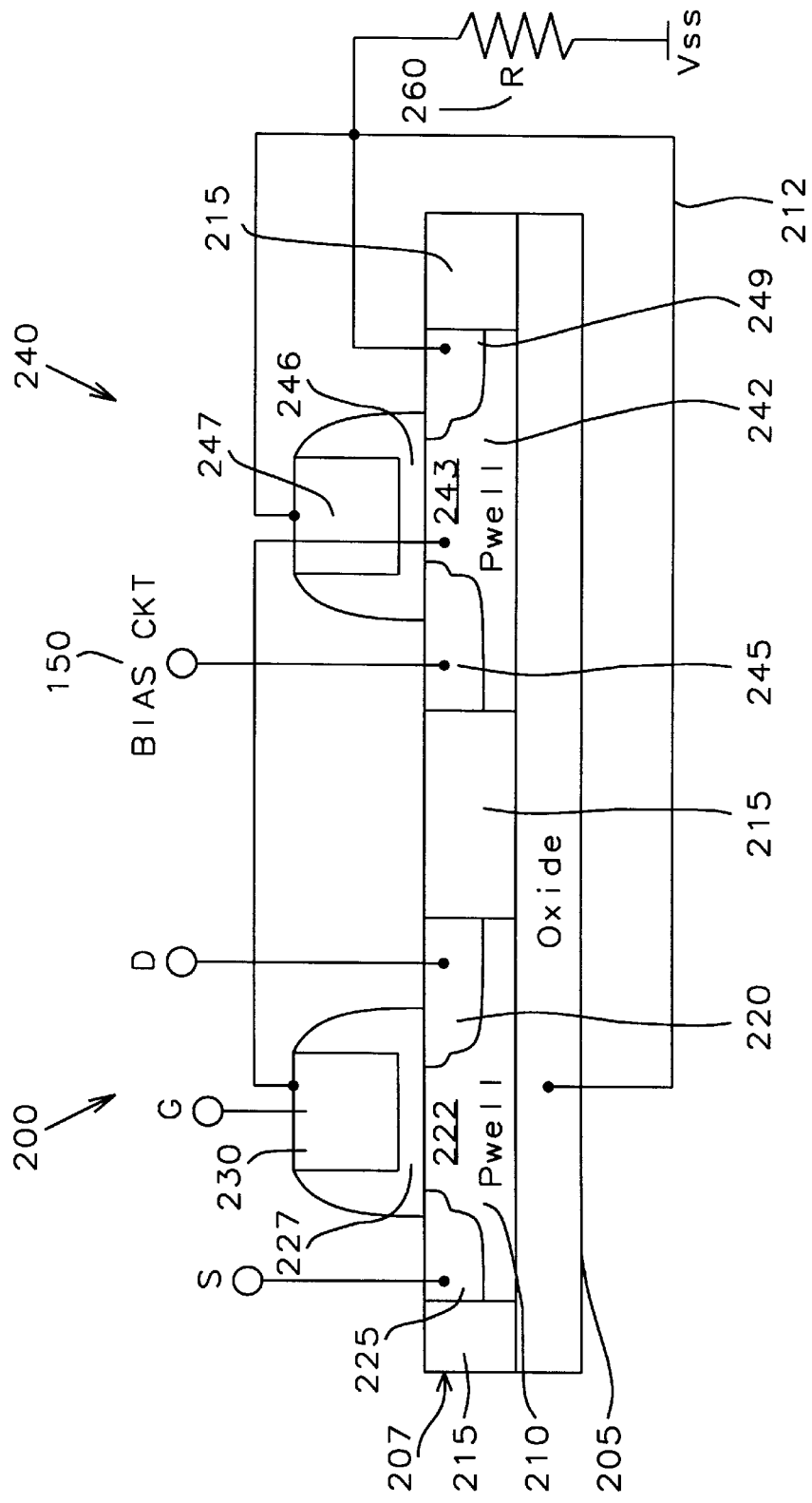
FIG. 4 is a cross-sectional view of a dynamic threshold voltage MOSFET on an insulating substrate of this invention.

A similar construction for a silicon-on-insulator (SOI) is shown in FIG. 4. In this case, the substrate 205 is an insulator such as silicon dioxide. An epitaxial semiconductor layer 207 is deposited on the insulator 205. The p-well 210 is formed by implanting a p-type material into the epitaxial layer to create the bulk region of the MOSFET 200. The drain region 220 and the source region 225 are formed by implanting an n-type material into the p-well 210. A gate 230 is formed on a gate oxide 227 on the surface of the epitaxial layer 207 above the channel region 222 between the drain region 220 and the source region 225.

The base of the accumulated-base bipolar transistor 240 is created by implanting a p-type material to form the p-well 242. The drain region 245 and the source region 249 are formed by implanting an n-type material into the p-well 242. The gate 247 is formed over the gate oxide 246 at the surface of the epitaxial layer 207 above the channel region 243 between the drain region 245 and the source region 249. The drain region 245 forms the collector of the accumulated-base bipolar transistor 240 and is connected to the bias circuit 150. The source region 249 forms the emitter of the accumulated-base bipolar transistor 240 and is connected 212 to the gate 247, the bulk region 210 of the MOSFET, and to the resistor R 260. The resistor R 260 is further connected to the substrate biasing voltage $V_{SS}$.

The shallow trench isolations 215 are formed to demarcate and isolate the MOSFET 200 and the accumulated-base bipolar transistor 240 from each other and form adjoining circuitry.

Figure 5:
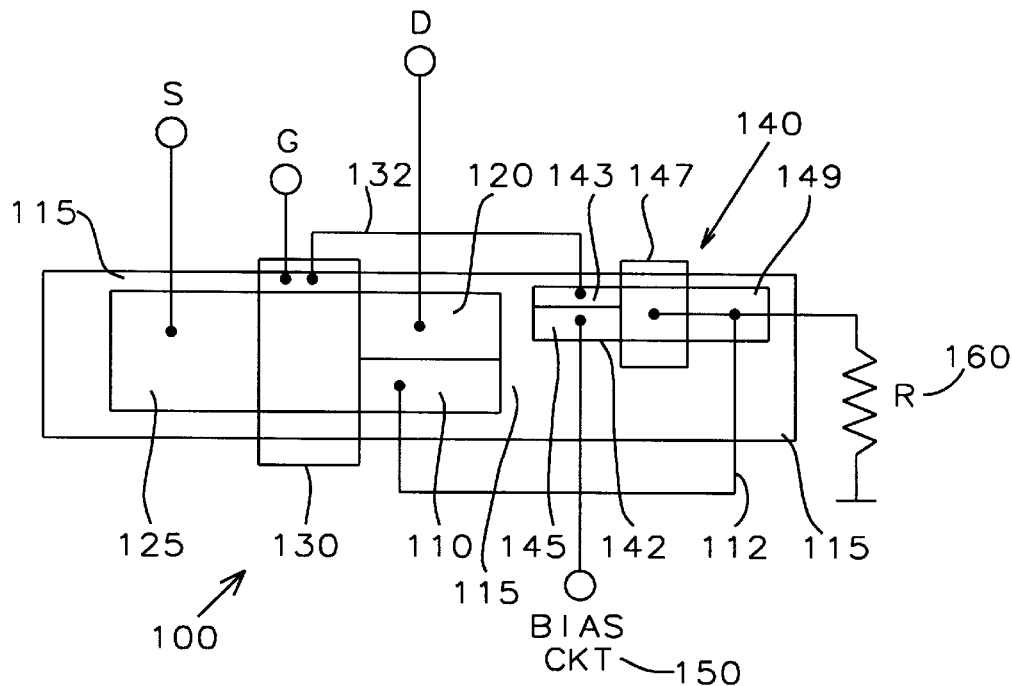
FIG. 5 is a top view of a dynamic threshold voltage MOSFET of this invention.

Refer now to FIG. 5 to review a top surface layout of the dynamic threshold voltage MOSFET of this invention. The p-well 110 forms the bulk of the MOSFET 100. The drain region 120 and the source region 125 are formed in the p-well 100 as described above. The gate 130 is formed between the drain region 120 and the source region 125 as described above.

The p-well 142 forms the base of the accumulated-base bipolar transistor 140. The base contact 143 is then connected 132 to the gate of the MOSFET 100. The drain region 145 and the source region 149 respectively form the collector and emitter of the accumulated-base bipolar transistor 140. The gate 147 is formed as described above between the drain region 145 and the source region 149. The emitter 149 of the accumulated-base bipolar transistor is connected 112 again as described above to the gate 147, the resistor R 160, and the bulk region 110 of the MOSFET 100. The resistor R 160 is further connected to the substrate biasing voltage $V_{SS}$.

Figure 6:
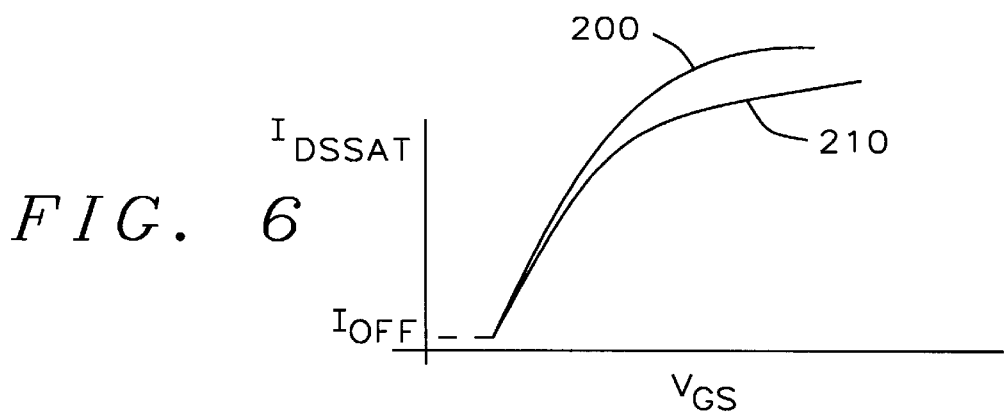
FIG. 6 is a plot of the gate-to-source voltage ($V_{GS}$) versus the drain-to-source current ($I_{DS}$) comparing the dynamic threshold voltage MOSFET of this invention to the MOSFET of the prior art.
Figure 7:
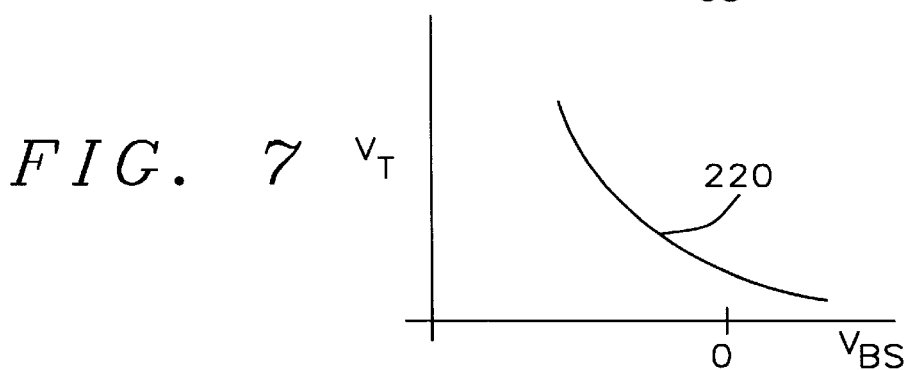
FIG. 7 is a plot of the threshold voltage ($V_T$) versus the bulk-to-source voltage ($V_{BS}$) of this invention.

Refer now to FIG. 6 to review the variation of the drain-to-source current versus the gate-to-source voltage. The plot 210 shows the results of a MOSFET of the prior art having the bulk connected to the source or the bulk-to-source voltage $V_{BS}$ equal to zero. The plot 200 shows the result of a dynamic threshold voltage MOSFET of this invention. When the gate-to-source voltage $V_{GS}$ of the dynamic threshold voltage MOSFET of this invention approaches a low value (0) the drain-to-source current becomes very low and will approach the value of the leakage current $I_{off}$. The accumulated-base bipolar transistor 140 of FIG. 2 is cut off and no current flows through the resistor R 160 of FIG. 2. The bulk to source voltage $V_{BS}$ is of the dynamic threshold voltage MOSFET is approaching a level of zero and the threshold voltage $V_t$ is high. The leakage current $I_{off}$ of the dynamic threshold MOSFET is equal to that of a conventional MOSFET of the prior art. As the gate-to-source voltage $V_{GS}$ of the dynamic threshold voltage MOSFET of this invention is increased, the accumulated-base bipolar transistor 140 of FIG. 2 begins to conduct thus forward biasing the bulk-to-source voltage of the MOSFET 100 of FIG. 2 ($V_{BS} \sim = V_{GS} = 0.7$ V). This will cause a decrease in the threshold voltage according to FIG. 2 and an increase drain-to-source saturation current $I_{DSsat}$ according to Eq. 1 above.

Figure 8:
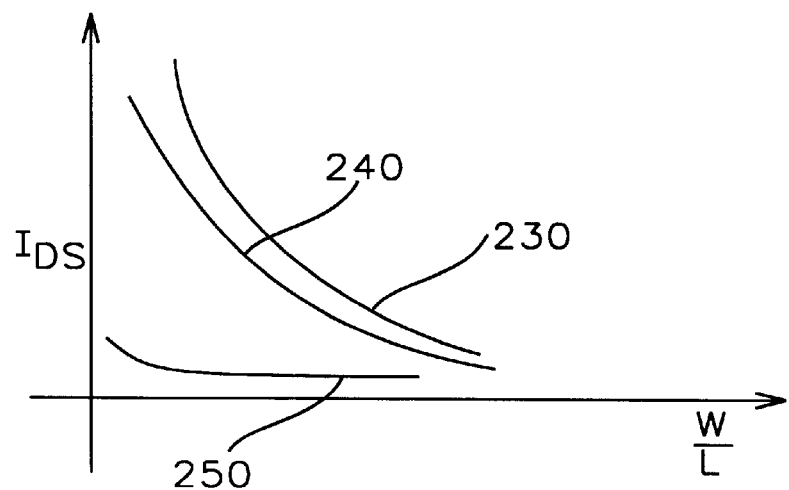
FIG. 8 is a plot of the saturation current ($I_{DSsat}$) versus the width to length ration (W/L) of the MOSFET comparing the dynamic threshold voltage MOSFET of this invention to the MOSFET of the prior art.

It should be noted that the accumulated-base bipolar transistor 140 of FIG. 5 could be significantly smaller than the MOSFET 100. Referring to FIG. 8, the plot 240 shows the drain-to-source saturation current $I_{DSsat}$ versus the width-to-length ratio (W/L) occupied by a MOSFET of the prior art having a zero voltage level for the bulk-to-source voltage $V_{BS}$. The plot 230 shows the drain-to-source saturation current $I_{DSsat}$ for a dynamic threshold voltage MOSFET of this invention. It will be noted that the dynamic threshold voltage MOSFET of this invention has a consistently higher the drain-to-source saturation current $I_{DSsat}$ than that of the MOSFET of the prior art, while the dynamic threshold MOSFET of this invention has an equivalent leakage current $I_{off}$ 250 to that of the MOSFET of the prior art.

Figure 9:
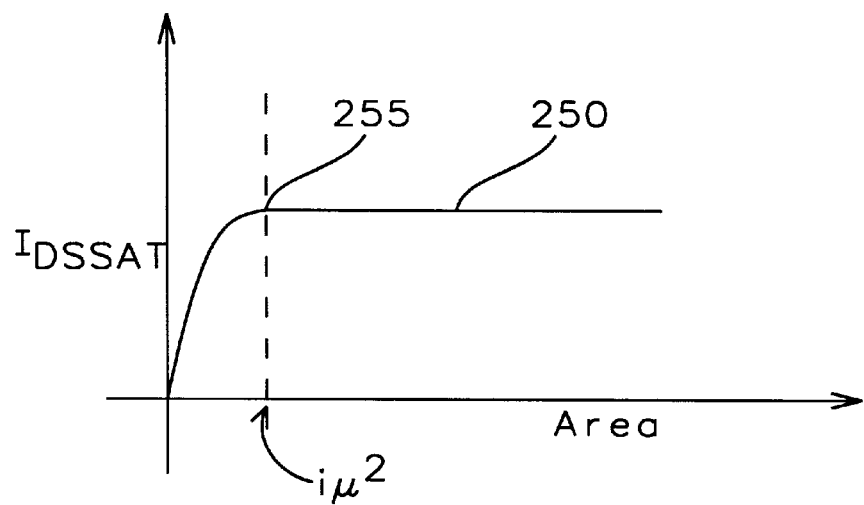
FIG. 9 is a plot of the saturation current ($I_{DSsat}$) versus the area of the MOSFET comparing the dynamic threshold voltage MOSFET of this invention to the MOSFET of the prior art.

FIG. 9 shows the comparison of the drain-to-source saturation current $I_{DSsat}$ versus the area to the accumulated base bipolar transistor 140 of FIG. 5. The plot 260 shows that the drain-to-source saturation current $I_{DSsat}$ increase until the area of the accumulated base bipolar transistor 140 is approximately $1_\mu^2$ in area. If the dynamic threshold voltage MOSFET has an area of approximately $10_\mu^2$ in area, the area of the accumulated base bipolar transistor 140 need only to be approximately 10% that of the dynamic threshold voltage MOSFET. The are of the accumulated base bipolar transistor only needs to be sufficiently large to ensure smooth conduction of the accumulated base bipolar transistor. The range of the area of the accumulated base bipolar transistor is from approximately 10% to 100% of the area of the MOSFET portion of the dynamic threshold voltage MOSFET.

The delay of a basic inverter circuit constructed of a single MOSFET of the prior art or a dynamic threshold voltage MOSFET of this invention is determined as:

$$\lambda d = \frac{V_{DD}}{I_{DSsat}} C$$

where:

$\lambda_d$ is the delay of the inverter.

C is the capacitance loading the inverter.

As can be seen from the above, the increase of the drain-to-source saturation current $I_{DSsat}$ decreases the delay of the inverter circuit.

It will be apparent to those skilled in the art that the embodiment as shown can have the material types modified to provide opposite polarities of current carries. Thus p-type material can be substituted for n-type material and vice versa and still be in keeping with the intent of this invention.

While this invention has been particularly shown and described with reference to the preferred embodiments thereof, it will be understood by those skilled in the art that various changes in form and details may be made without departing from the spirit and scope of the invention.

What is claimed is:

1. A dynamic threshold voltage MOSFET constructed on a substrate having increased drain-to-source saturation current, comprising:

a first diffusion-well of a material of a first conductivity type formed at the surface of the substrate to form a bulk region;

a source region and a drain region of a material of a second conductivity type diffused into the diffusion-well;

a first gate placed on a first oxide surface above the substrate between the source and drain regions;

an accumulated base bipolar transistor having a base connected to the gate, an emitter connected to the diffusion-well, and a collector;

a resistor connected between the emitter and a substrate biasing voltage source; and a biasing circuit connected to the collector of the accumulated base bipolar transistor to provide a bias voltage for said accumulated base bipolar transistor.

2. The dynamic threshold voltage MOSFET of claim 1 wherein a voltage developed between the bulk and the source is increased as a voltage is applied between the gate and the source is increased thus increasing the drain-to-source saturation current.

3. The dynamic threshold voltage MOSFET of claim 1 wherein the accumulated base bipolar junction transistor comprises:

a second diffusion-well of the material of the first conductivity type formed at the substrate to form the base of the accumulated base bipolar transistor;

a source region and an emitter region of the material of the second conductivity type diffused into the second diffusion-well to form the collector and the emitter of the accumulated base bipolar junction transistor; and a second gate placed on a second oxide surface and coupled to the source region.

4. The dynamic threshold voltage MOSFET of claim 1 wherein the substrate is a semiconductor substrate of a material of the second conductivity type and the first diffusion is diffused into the semiconductor substrate.

5. The dynamic threshold voltage MOSFET of claim 1 wherein the substrate is an insulating material having a semiconductor epitaxial layer of the material of the second conductivity type formed on the surface of the insulating material and the first diffusion-well is diffused into the semiconductor epitaxial layer.

6. The dynamic threshold voltage MOSFET of claim 1 wherein the accumulated base junction transistor occupies an area that is from 10% to 100% area of the first diffusion-well.

7. A dynamic threshold voltage ($V_T$) modification circuit to dynamically alter the threshold voltage ($V_T$) of a MOSFET during operation to increase a drain-to-source saturation current while minimizing a drain-to-source off current, comprising:

an accumulated base bipolar transistor having a base connected to a gate of said MOSFET, an emitter connected to a bulk region of said MOSFET, and a collector;

a resistor connected between the emitter of the accumulated base bipolar transistor and a substrate biasing voltage source; and a voltage biasing circuit connected to the collector to provide a biasing voltage to the accumulated base bipolar transistor.

8. The dynamic threshold voltage ($V_T$) modification circuit of claim 7 wherein a voltage developed at the emitter of the accumulated base bipolar junction transistor is increased as a voltage applied between the gate and source of the MOSFET is increased, thus increasing the drain-to-source saturation current of the MOSFET.

9. The dynamic threshold voltage ($V_T$) modification circuit of claim 7 wherein the accumulated base bipolar transistor occupies from 10% to 100% the area of the MOSFET.

* * * * *